United States Patent [19]
Koren et al.

[11] Patent Number: 5,309,469
[45] Date of Patent: May 3, 1994

[54] MONITORING OPTICAL GAIN OF SEMICONDUCTOR OPTICAL AMPLIFIER

[75] Inventors: Uziel Koren, Fair Haven; Michael A. Newkirk, Tinton Falls, both of N.J.

[73] Assignee: AT&T Bell Laboratories, Murray Hill, N.J.

[21] Appl. No.: 967,593

[22] Filed: Oct. 28, 1992

[51] Int. Cl.[5] .................. H01S 3/133; H01S 3/103
[52] U.S. Cl. ........................... 372/50; 372/31; 372/43
[58] Field of Search .............. 372/43, 50, 38, 31, 372/26; 385/14; 359/344

[56] References Cited

U.S. PATENT DOCUMENTS 4,954,786 10/1990 Yamakawa et al. ............... 372/31

OTHER PUBLICATIONS

"Two-Section Semiconductor Optical Amplifier Used as an Efficient Channel Dropping Node" C. Jorgensen, et al., IEEE Phot. Tech. Lett., vol. 4, No. 4, Apr. 1992, pp. 348-350.

"Strain-Compensated Strained-Layer Superlattices for 1.5 m Wavelength Lasers" B. I. Miller et al., Appl. Phys. Lett 59(18), May 6, 1991, pp. 1952-1954.

"Semi-Insulating Blocked Planar BH GainAsP/InP Laser With High Power and High Modulation Bandwidth" U. Koren et al., Electronics Lett, vol. 24, No. 3, Feb. 4, 1988, pp. 138-140.

"Traveling Wave Semiconductor Laser Amplifier Detectors," M. Gustavsson et al. J. Lightwave Technology, vol. 8, No. 4, Apr. 1990, pp. 610-617.

Primary Examiner—Rodney B. Bovernick
Assistant Examiner—Robert McNutt
Attorney, Agent, or Firm—Eli Weiss; Stuart H. Mayer

[57] ABSTRACT

In this invention, a semiconductor device designed for use as an optical amplifier is provided with three sections; an input section, a middle section and an output section. A continuous optical waveguide extends through the input section, the middle section and the output section and the three sections are electrically isolated from each other. More specifically, a semiconductor laser amplifier is electrically split into three separate sections by implanting ions of, for example, hydrogen, helium or fluorine into the areas of the semiconductor amplifier which are between the middle section and the two end sections. The ion implantation provides a high degree of electrical isolation between the various sections, but it does not alter the continuity of the optical waveguide which passes through the three sections. In operation, each section is coupled to a bias source to forward bias the device, and the ratio of the voltages on the two end sections induced by the optical signal is proportional to the gain of the semiconductor amplifier.

10 Claims, 3 Drawing Sheets

MONITORING OPTICAL GAIN OF SEMICONDUCTOR OPTICAL AMPLIFIER

TECHNICAL FIELD

This invention relates generally to semiconductor devices and, more particularly, to a semiconductor device which provides optical gain monitoring when operated as an optical amplifier.

BACKGROUND OF THE INVENTION

Semiconductor laser amplifiers are becoming increasingly more important components for optical signal processing applications. In addition to simple loss compensation and switching functions, a semiconductor laser amplifier can provide simultaneous amplification and detection of an optical signal. Recently, amplifiers which exploit this dual capability have demonstrated improved detection capability by employing a split contact and performing the detecting function at the rear contact. See C. Jorgensen et al., "Two-Section Semiconductor Optical Amplifier Used as an Efficient Channel Dropping Node", IEEE Photon. Technol. Letters, Vol. 4, pp. 348-350, 1992.

As photonic integrated circuits with integrated semiconductor laser amplifiers become increasingly complex, it becomes necessary to monitor amplifier gain to perform automatic gain control or to enhance system robustness. This invention is directed toward satisfying this need of monitoring the optical gain of a semiconductor laser amplifier.

SUMMARY OF THE INVENTION

This invention relates to a semiconductor laser amplifier which, in addition to amplifying an optical signal, can also be used for monitoring the amplifier gain. It has been discovered that when a semiconductor laser amplifier is electrically, not optically split into three separate sections, two end sections and a middle section, and the three sections are forward biased in parallel, the optical gain of the semiconductor amplifier is related to the ratio of the voltages at the two end sections; and this relationship depends only on fixed quantities such as the lengths of the three sections.

Detailed Description

In this invention, the gain of a semiconductor optical amplifier can be monitored by splitting the semiconductor optical amplifier into three electrically isolated sections which extend along a continuous optical waveguide. A first section is located at the input end of the amplifier, a second section is located at the output end of the amplifier, and a middle section is located between the first and second sections. Each section supports an electrical contact which is used to individually forward bias each section. In operation, the ratio of the voltages at the contacts coupled to the first or input section and third or output section is related to the gain of the amplifier.

Figure 1:
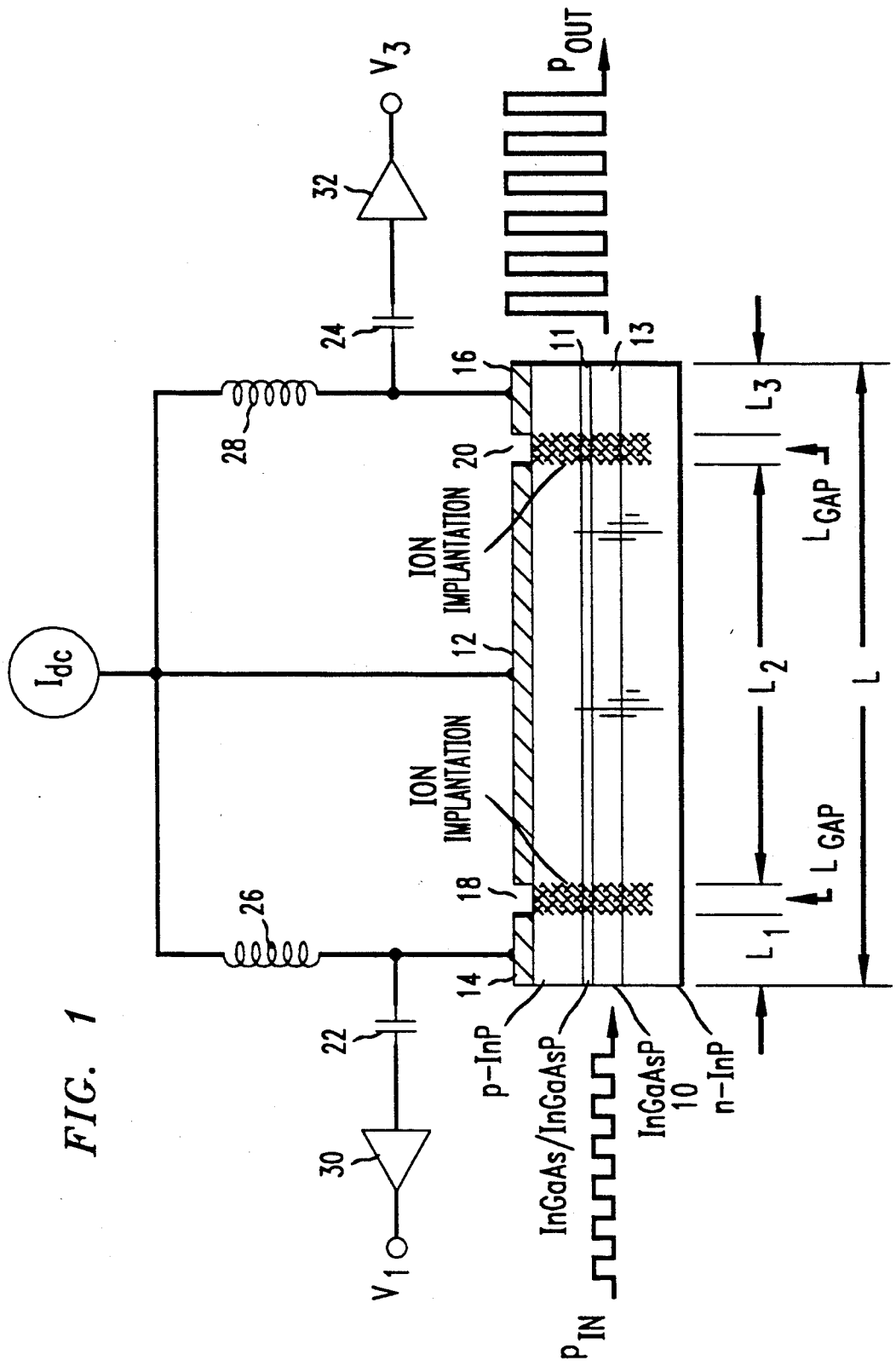
FIG. 1 schematically illustrates structure according to the invention for monitoring the optical gain of a semiconductor laser amplifier.

Referring to FIG. 1, there is illustrated a schematic diagram of a semiconductor laser amplifier which provides monitoring of the optical gain. The semiconductor amplifier 10 material can be grown using atmospheric pressure metalorganic vapor phase epitaxy. The base wafer comprises a strain-compensated 1.55 μm wavelength multiquantum well gain layer 11 on top of a 2800 Å thick InGaAsP passive waveguide 13 similar to that in B. I. Miller et al., "Strain-Compensated Strained-Layer Superlattices for 1.51 μm Wavelength Lasers", Appl. Phys. Lett., vol. 58, pp. 1952-1954, 1991. The quantum well stack is composed of six 30 Å thick InGaAs wells with 1.3% compressive strain separated by 125 Å thick InGaAsP barriers with 0.2% tensile strain having peak photoluminescence wavelength of 1.25 μm. The semiconductor amplifier 10 uses the semi-insulating planar buried-heterostructure as disclosed by U. Koren et al., "Semi-Insulating Blocked Planar Buried Heterostructure GaInAs-InP Laser With High Power and High Modulation Bandwidth", Electron. Lett., vol. 24, pp. 138-139, 1988. Mesas which are 3 μm wide are created by standard photolithography and wet chemical etching, followed by two metalorganic vapor phase epitaxy regrowths for current blocking, cladding, and p-contacting layers. The semiconductor amplifier 10 is 880 μm long with the top contact divided into three sections; a 640 μm middle section 12 and 100 μm input and output sections 14, 16 at the front and rear facets separated by 20 μm gaps 18, 20. The three sections 12, 14 and 16 are electrically isolated from each other by implanting ions in the gap regions 18, 20. Ions which can be used for this purpose can include, but are not Emited to hydrogen, helium and fluorine. With the three sections forward biased, the device was found to have a lasing threshold of 30 mA before the facets are anti-reflection coated.

A theoretical description of the three-section semiconductor laser amplifier 10 is provided below. The rate equation for the carrier/photon dynamics at a given distance along the amplifier is $$\frac{d}{dt} n = -v_g g_n P_o n - g v_p p - \frac{n}{\tau_{sp}} \tag{1}$$

where n and p are small-signal carrier density and photon density modulation amplitudes, $g_n$ and g are differential gain and unsaturated material gain, $P_o$, is steady-state photon density, $v_g$ is group velocity, and $\tau_{sp}$ is carrier spontaneous lifetime. Making the simplifying assumption that the amplifier operates in the unsaturated regime, then for modulation frequencies less than $1/\tau_{sp}$ relationship (1) becomes $$n(t) = -g v_g \tau_{sp} p(t). \tag{2}$$

The small-signal diode junction voltage v is also proportional to the carrier density modulation, $$v(t) = m V_T \frac{n(t)}{N_o}, \tag{3}$$

where m is a constant involving the density of states, $V_T$ is the thermal voltage, and $N_o$ is steady-state carrier density. Combining relationships (2) and (3) gives $v(t) \alpha p(t)$.

The internal Gain G of the amplifier is the ratio of the input and output photon density modulation. For unsaturated operation, $$G = \frac{P_{out}}{P_{in}} = \exp[(\Gamma g - \alpha)(L_1 + L_2 + L_3) - 2\alpha_{gap}L_{gap}] \quad (4)$$

where $\Gamma$ is the mode confinement factor, $\alpha$ is the loss coefficient, and $\alpha_{gap}$ is excess loss from the unpumped gap regions. Relating G to the facet contact voltages $v_1$ and $v_3$ requires averaging the local photon density under the contacts. Performing the integrals, one finds the voltage gain $$\frac{v_3}{v_1} = \frac{\exp[(\Gamma g - \alpha)(L_1 + L_2) - 2\alpha_{gap}L_{gap}] \frac{\exp[(\Gamma g - \alpha)L_3] - 1}{(\Gamma g - \alpha)L_3}}{\frac{\exp[(\Gamma g - \alpha)L_1] - 1}{(\Gamma g - \alpha)L_1}} \quad (5)$$

For the case where the facet contacts have equal length ($L_3 = L_1$), this relationship can be combined with relationship (4) to give $$G(dB) = \quad (6)$$

$$\left[1 + \frac{L_3}{L_1 + L_2}\right] \cdot \frac{v_3}{v_1} (dB) + 4.34[2\alpha_{gap}L_{gap}]\left[\frac{L_3}{L_1 + L_2}\right]$$

where G and $v_3/v_1$ are now expressed in decibels. In a log-log plot, G is therefore a linear function of the voltage gain $v_3/v_1$. This relationship depends only on fixed quantities, as the bias-dependent small-signal gain g has dropped out of the equation. Also, the offset due to gap loss is small (<0.3 dB) for all reasonable values of $\alpha_{gap}$ (<100 cm$^{-1}$). For this device the slope $$1 + \frac{L_3}{L_1 + L_2} = 1.14.$$

Returning to FIG. 1, there is illustrated the inventive semiconductor amplifier connected to enable its optical gain to be monitored. In a test of the invention, an optical input signal $P_{in}$ from an MQW distributed Bragg reflector laser at 1.561 μm is directly modulated by a 50 MHz sine wave. The light is then attenuated and coupled into the amplifier 10 with an objective lens. The input light is TE polarized and, in this instance, the average incident optical power is determined to be −6 dBm. The three sections 14, 12, 16 of the semiconductor amplifier 10 are forward biased in parallel; and the ac voltage signals at the contacts of sections 14, 16 are coupled out with a pair of bias tees made up of condensers 22, 24 and inductors 26, 28. The ac signal from the contact on top of section 14 is electrically amplified by amplifier 30; and the ac signal from the contact on top of section 16 is electrically amplified by amplifier 32. The gain of the semiconductor amplifier is proportional to the ratio of the amplified signals from amplifiers 30, 32.

The amplified optical signal $P_{out}$ from the semiconductor amplifier 10 is collected with a second objective lens and monitored with an optical power meter, where the detected power from background spontaneous emission is subtracted from the measurement. The voltage signals from the contacts on sections 14, 16 are then correlated with the amplifier optical gain.

Figure 2:
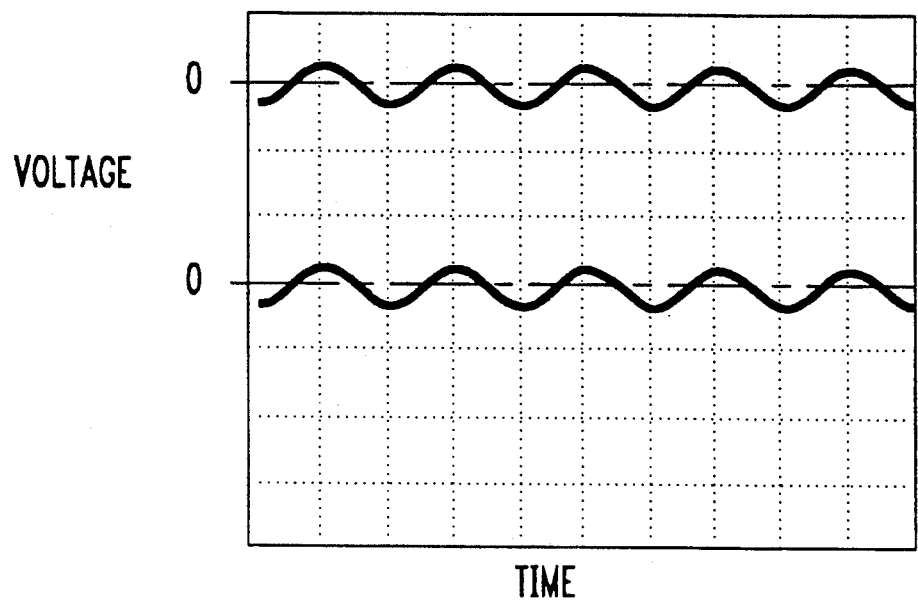
FIG. 2 is a graphical representation of the voltage signal at the input and output of the semiconductor laser amplifier at a bias current of $I_{dc} = 26$ mA.
Figure 3:
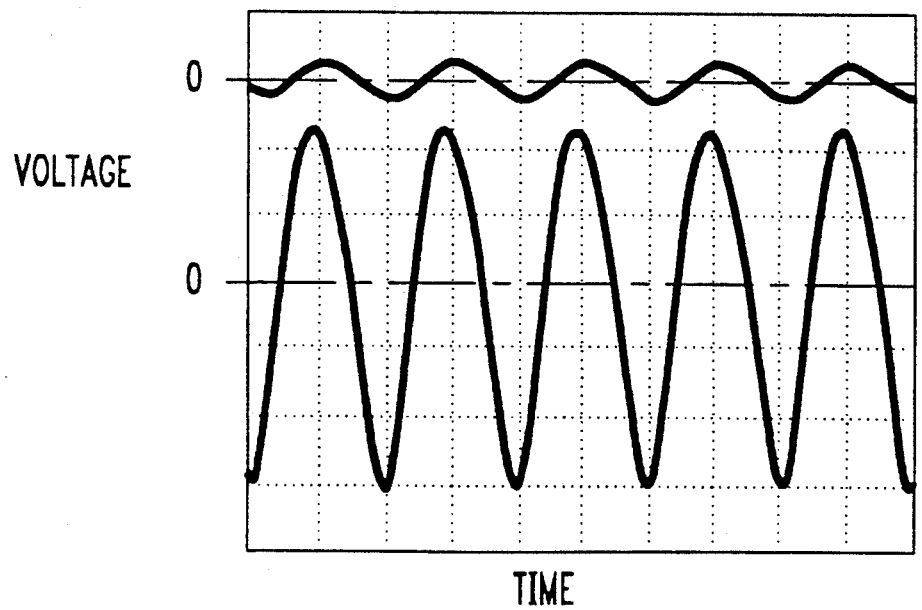
FIG. 3 is a graphical representation of the voltage signal at the input and the output of the semiconductor laser amplifier at a bias current of $I_{dc} = 110$ mA.

FIGS. 2 and 3 illustrate typical test results. The voltages are measured as a function of amplifier bias current $I_{dc}$ for constant average incident optical power. At $I_{dc}$=26 mA of bias, the semiconductor amplifier 10 operated near zero loss where the voltage gain is unity. Referring to FIG. 2, the top plot is the voltage at the input section 14 and the bottom plot in the voltage at the output section 16. As the bias is increased, the voltage modulation at the output section 16 also increases. FIG. 3 illustrates that at $I_{dc}$=110 mA of bias, the voltage gain is 12.1 dB. In FIG. 3, the top plot is the voltage at the input section 14 and the bottom plot is the voltage at the output section 16, shown at half scale.

Figure 4:
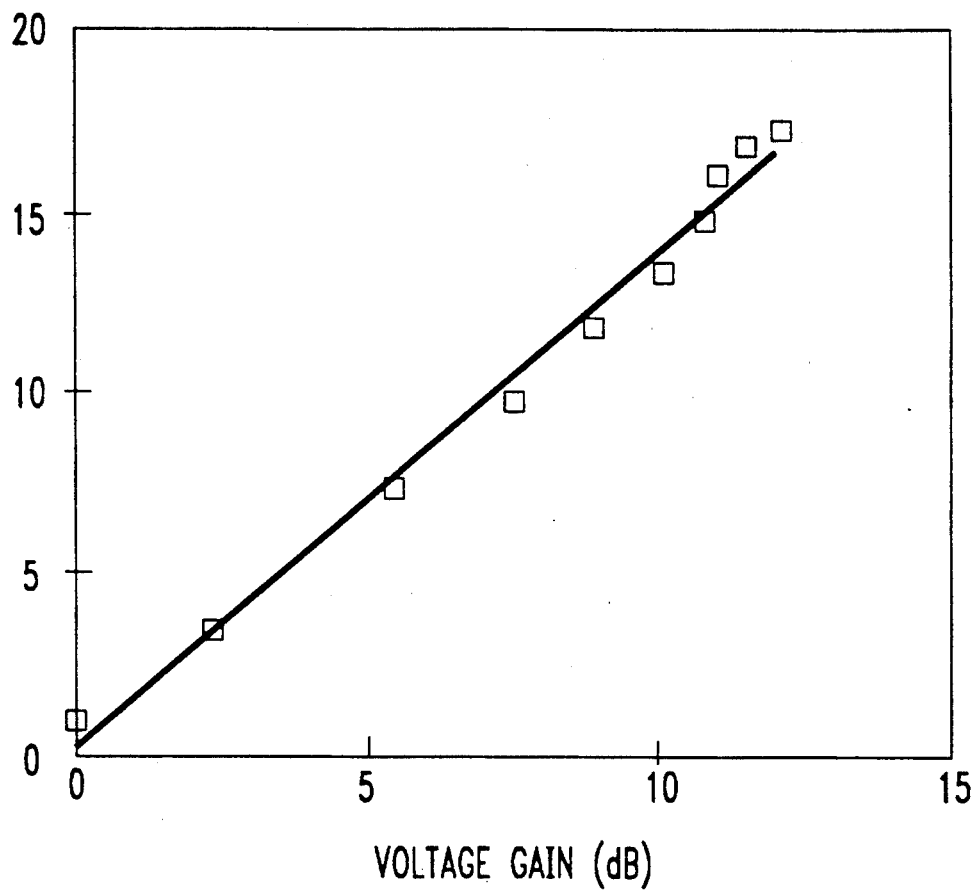
FIG. 4 is a graphical representation of amplifier internal optical gain vs. voltage gain of the semiconductor laser amplifier.

FIG. 4 illustrates the internal gain of the semiconductor amplifier 10 vs. voltage gain for the same range of bias currents. The optical signal gain at 110 mA of bias is 7.2 dB, and the input coupling loss and $\alpha_{gap}$ are estimated to be −9 dB and 60 cm$^{-1}$ respectively to give 16.2 dB internal gain at the bias current. It is to be noted that the data fall along a straight line over the full range of bias currents. The slope of the line, which is independent of estimates for coupling and $\alpha_{gap}$, is 1.35, which is slightly higher than the theoretical value of 1.14. A more detailed theoretical treatment which includes gain saturation effects could possibly account for the small discrepancy.

In summary, it is disclosed that by providing a semiconductor optical amplifier with three electrically isolated sections which extend along the optical waveguide from the input to the output, the optical gain can be monitored by comparing voltage changes at the two end sections. Experimental data, which are in agreement with theory, shows that for small signal measurements on a three-contact 1.55 μm multiquantum well amplifier, optical gain is proportional to the voltage gain.

It will thus be appreciated that those skilled in the art will be able to devise numerous arrangements which, although not explicitly shown or described herein, embody the principles of the inventions. Accordingly, all such alternatives, modifications and variations which fall within the spirit and broad scope of the appended claims will be embraced by the principles of the invention.

We claim:

1. A semiconductor optical amplifier
   comprising
   an input section, an output section and a middle section located between said input and output sections and including a gain medium and a continuous optical waveguide which extend through said input, middle and output sections,
   means to electrically isolate said input, middle and output sections from each other,
   means coupled to bias each of said three sections, and
   means coupled to detect the change of voltage at the input section and output section a first electrical contact coupled to the input section for applying a forward bias to the input section, a second electrical contact coupled to the middle section for applying a forward bias to the middle section, and a third electrical contact coupled to the output section for applying a forward bias to the output section, each electrical contact covers substantially all of the top surface of its associated section and each electrical contact is electrically isolated from each other, wherein said means to electrically isolate said input, output and middle sections from each other comprises ions implanted into the semiconductor device in the area intermediate the input and middle sections and the middle and output sections.

2. The semiconductor optical amplifier of claim 1 further comprising means coupled to determine the ratio of the voltage at the input and output sections.

3. The semiconductor device of claim 1 wherein the input and output sections have lengths which are shorter than the length of the middle section.

4. The semiconductor device of claim 3 wherein the input and output sections have lengths which are substantially equal.

5. The semiconductor device of claim 1 wherein the input, output and middle sections have lengths which are equal.

6. The semiconductor device of claim 1 wherein said ions implanted into the semiconductor device are hydrogen ions.

7. The semiconductor device of claim 1 wherein said ions implanted into the semiconductor device are helium ions.

8. The semiconductor device of claim 1 wherein said ions implanted into the semiconductor device are fluorine ions.

9. A semiconductor optical amplifier comprising an input section, an output section and a middle section located between said input and output sections and including a gain medium and a continuous optical waveguide which extend through said input, middle and output sections, means to electrically isolate said input, middle and output sections from each other, means coupled to bias each of said three sections, and means coupled to detect the change of voltage at the input section and output section, wherein said input, middle and output sections are each forward biased, first means coupled to said input section to detect the bias potential on said input section, and second means coupled to said output section to detect the bias potential on said output section.

10. The semiconductor device of claim 9 wherein said input section is coupled to said bias means by a first bias tee;

said output section is coupled to said bias means by a second bias tee; and said middle section is coupled directly to said bias means.

* * * * *